United States Patent [19]

Chuang et al.

[11] Patent Number: 4,864,539
[45] Date of Patent: Sep. 5, 1989

[54] RADIATION HARDENED BIPOLAR STATIC RAM CELL

[75] Inventors: Ching-Te K. Chuang, South Salem; Edward Hackbarth, White Plains; Denny D. Tang, Pleasantville, all of N.Y.

[73] Assignee: International Business Machines Corporation, Armonk, N.Y.

[21] Appl. No.: 3,525

[22] Filed: Jan. 15, 1987

[51] Int. Cl.[4] .............................................. G11C 11/40
[52] U.S. Cl. ...................................... 365/155; 365/179
[58] Field of Search ................................ 365/179, 155

[56] References Cited

U.S. PATENT DOCUMENTS

| | | | |
|---|---|---|---|
| 4,255,674 | 3/1981 | Grenier et al. | 365/155 |
| 4,314,359 | 2/1982 | Kato et al. | 365/179 |
| 4,322,821 | 3/1982 | Lohstroh | 365/155 |
| 4,541,003 | 9/1985 | Otsuka et al. | 357/74 |

OTHER PUBLICATIONS

IBM Technical Disclosure Bulletin-vol. 21, No. 1 Jun. 1978; p. 175-176.

K. Yamaguchi et al, IEEE Dig. of ISSCC, 1986 pp. 214-215 "A 3.5 NS 2W 20 mm$^2$ 16 Kb bipolar RAM".
Y. Nakase et al, Dig. of VLSI Tech. Sym. pp. 75-76, 1986 "A double wordline structure in ECL RAM".
"Soft Error Rates in Static Bipolar RAMs2" by Sai-Halasz et al, Proceedings of the IEEE International Electron Devices Meeting, Dec. 1983 pp. 344-347.

Primary Examiner—James W. Moffitt
Attorney, Agent, or Firm—Thomas J. Kilgannon, Jr.

[57] ABSTRACT

This invention relates generally to Static Random Access Memory (SRAM) cells and more particularly, relates to a SRAM cell wherein soft-error due to α-particle radiation is reduced by permitting the potential at the common-emitter node of the cross-coupled transistors of the memory cell to swing freely. Still more particularly, it relates to a SRAM cell wherein the common-emitter node of the cell is decoupled from a heavily capacitively loaded word line with its common constant current source by means of a constant current source or current mirror disposed in each cell between the common-emitter node and the word line.

6 Claims, 2 Drawing Sheets

RADIATION HARDENED BIPOLAR STATIC RAM CELL

TECHNICAL FIELD

This invention relates generally to Static Random Access Memory (SRAM) cells and more particularly, relates to a SRAM cell wherein soft-error due to α-particle radiation is reduced by permitting the potential at the common-emitter node of the cross-coupled transistors of the memory cell to swing freely. Still more particularly, it relates to a SRAM cell wherein the common-emitter node of the cell is decoupled from a heavily capacitively loaded word line with its common constant current source by means of a constant current source or current mirror disposed in each cell between the common-emitter node and the word line.

BACKGROUND OF THE INVENTION

The high speed of bipolar integrated circuits has been a major attraction to circuit designers in both logic and memory applications. Performance of bipolar circuits has been enhanced by a combination of down-scaling and the use of advanced processing methods. This advanced performance has, however, been accompanied by a greater susceptibility to soft-error caused by α-particle radiation.

A major candidate for high speed static bipolar memory cells has been the Emitter Coupled Logic (ECL) cell. U.S. Pat. No. 4,255,674, filed Jan. 2, 1979, shows a cell of this type wherein one of the emitter regions of each transistor of the flip-flop of the cell is connected to a supply line and the other emitter regions are connected to read/write lines. The discussion in the specification of this reference characterizes the supply as a current source G. The latter is the only current source disclosed and appears to be that current source which is connected to and shared by all cells connected to a common word line.

A later reference, U.S. Pat. No. 4,314,359, directly addresses the problem of erroneous operation of ECL-type memory cells due to α-particles. In addition to describing ECL bipolar memory cells of the type shown in the above, first mentioned reference, it discusses in detail the emitters of the cell which are commonly connected to a data-holding constant current source $I_{ST}$. The latter is the same as current source $IR_1$ shown in FIG. 3. $IR_1$ is shown connected to word line WL1 which serves a plurality of ECL memory cells $MS_{11}$–$MS_{12}$. There is then no separate constant current source in each individual cell. As a result, the capacitance associated with word line $W_{12}$ which is quite large, ties down the potential of emitters $C_2$ and $C_4$. The approach of the reference to overcoming soft error due to α-particle impingement is to include additional capacitance between the collector and base regions of each transistor pair of each memory cell.

In a more recent reference, U.S. Pat. 4,541,003, filed June 14, 1982, an ECL cell is shown in FIG. 23 and the comment is made that electron-hole pairs formed by irradiation of α-particles easily causes the state of the flip-flop to be reversed, resulting in the occurrence of soft error. Such errors are eliminated in the reference by means of a semiconductor shielding element. A still more recent reference entitled "A 3.5NS 2W 20 mm² 16Kb bipolar RAM" by K. Yamaguchi et al, IEEE Dig. of ISSCC, 1986, pp. 214-215 shows the incorporation of a high capacitance tantalum pentoxide ($Ta_2O_5$) film to increase the storage node capacitance.

In yet another reference entitled "A double wordline structure in ECL RAM" by Y. Nakase et al, Dig. of VLSI Tech. Symp. pp. 75-76, 1986, the splitting of a top-word line is used to increase the potential difference between the collector nodes of the flip-flop transistors.

From all the foregoing, it should be clear that none of the above cited references provide an ECL or bipolar static RAM cell wherein the potential of the common-emitter node of the cross-coupled transistors is allowed to swing freely. In all cases, some expedient is utilized which affects word line or device capacitance and where constant current sources are mentioned, such sources are those normally connected to a word line and commonly connected to a plurality of ECL cells which share the same word line.

It is, therefore, a principal object of the present invention to provide a SRAM cell of the ECL type which has a reduced susceptibility to soft errors due to α-particle radiation.

Another object is to provide a SRAM cell of the ECL type wherein means for reducing soft error due to α-particle radiation are connected between commonly connected emitters of a cell and its associated word line.

Another object is to provide a SRAM cell of the ECL type wherein a constant current source or a current mirror is connected between commonly connected cell emitters and a word line.

Still another object is to provide a SRAM cell of the ECL type wherein another constant current source or current mirror is connected between commonly connected emitter and a word line to which the usual constant current source is connected.

BRIEF SUMMARY OF THE INVENTION

The present invention relates to a Static Random Access Memory (SRAM) cell of the Emitter Coupled Logic (ECL) type wherein the potential at the common-emitter node of the cross-coupled transistors of the memory cell is allowed to swing freely. This is accomplished by interposing means for reducing errors due to α-particles between the common-emitter node of the cross-coupled transistors of an ECL cell and an associated word line which is normally connected to a shared constant current source.

The means for reducing errors due to α-particle radiation may take the form of a constant current source which is connected to the common-emitter node of a memory cell and its associated word line. The net effect of interposing such a source is that the emitters are allowed to float. Thus, when an ECL experiences a transient due to an α-particle strike and the common-emitter node is connected to a constant current source, the sudden quenching of the base-emitter voltage ($V_{BE}$) of the ON device of the cross-coupled transistors is cushioned by allowing the common-emitter node to dip at the same time. The introduction of the constant current source between the common-emitter node of a cell and the commonly connected word line basically increases the $Q_{CRIT}$ of the cell by reducing the capacitance on the common-emitter node to a very small value. In this way, the potential at the common-emitter node can float or swing freely.

In another implementation, a current mirror circuit is substituted for the constant current source to achieve a similar reduction of capacitance on the common-emitter node of the cell thereby permitting it to float or swing freely.

From the foregoing, it should be clear that a constant current source or a current mirror circuit must be added to each cell. While more circuitry is added to achieve the reduction in error rate, it should be appreciated that the approach used permits the removal of circuit elements like resistors normally used in an ECL cell. The resulting cell area is approximately the same as the area of prior art cells. In any event, the addition of a constant current source or a current mirror circuit between the common-emitter node and the commonly connected word line provides a $Q_{CRIT}$ which is about two times greater than that of prior art cells resulting in a soft error rate of at least eight times smaller for the present cell.

The foregoing and other objects, features and advantages of the present application will be apparent from the following more particular description of a preferred embodiment.

DESCRIPTION OF THE PREFERRED EMBODIMENTS

Figure 1:
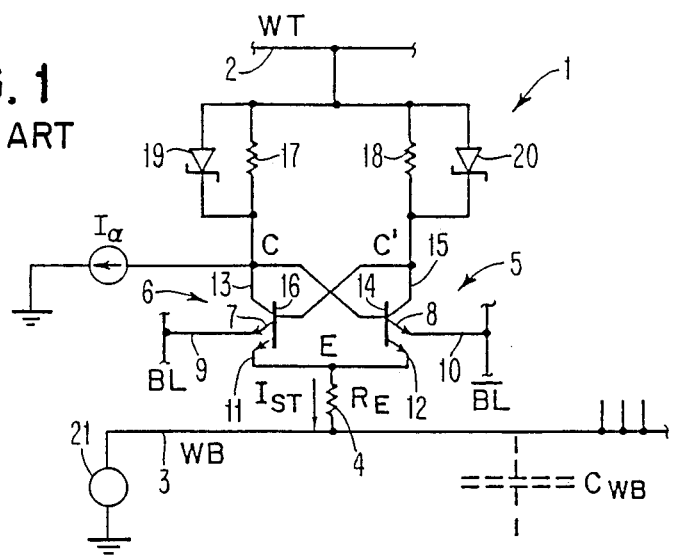
FIG. 1 is a schematic drawing of a prior art Emitter Coupled Logic (ECL) cell wherein the common-emitter node is connected to a lower word line by means of a resistor.

FIG. 1 is a schematic drawing of a prior art ECL cell wherein the common-emitter node is connected to a lower word line by means of a resistor. In FIG. 1, ECL cell 1 is shown connected across a pair of word lines 2,3 otherwise identified in FIG. 1 as WT, WB, respectively, via a resistor 4 otherwise identified in FIG. 1 as $R_E$. A pair of transistors 5,6 of the double emitter type have emitters 7,8 connected to bit lines 9,10, respectively, which are otherwise identified in FIG. 1 as BL, $\overline{BL}$, respectively. Emitters 11,12 are shown connected to node E which is also connected to resistor $R_E$. In FIG. 1, the collector 13 of transistor 6 is shown cross-coupled to the base 14 of transistor 5. Similarly, the collector 15 of transistor 5 is shown cross-coupled to the base 16 of transistor 6. Resistors 17,18, shunted by diodes 19,20, respectively, are connected to collectors 13,15, respectively, at one end thereof and commonly connected at the other ends thereof to word line WT.

In the usual operating environment, a plurality of ECL cells 1 is connected between word line WT and WB and a plurality of such arrangements make up an ECL memory array. When connected in array form, each word line WB is connected to a shared constant current source which is shown at 21 in FIG. 1.

Information is stored in ECL cell 1 by placing one of transistors 5,6 in the ON or conducting state while the other is in te OFF or nonconducting state. ECL cell 1 is written into by pulling up word line WT and simultaneously pulling down either BL or $\overline{BL}$. Reading of ECL cell 1 is accomplished by pulling word line WT up and sensing the resulting signal via the ON transistor 5 or 6 and bit lines BL or $\overline{BL}$. The above described cell and mode of operation is well-known. However, it is in the standby state of cell 1 that problems arise when one of collectors 13,15 of transistors 6,5, respectively, is struck by an α-particle. More particularly, when the collector of the OFF transistor experiences an α-particle strike, the charge induced at its collector node C causes current $I_\alpha$ as shown in FIG. 1 to flow out of node C thereby dropping the voltage on base 14 of 0N transistor 5. This results in a drop in the base-emitter voltage, $V_{BE}$, of transistor 5 causing that device to turn OFF resulting in a false output when that cell is read. The reason the $V_{BE}$ drops is because the voltage at node E changes very little due to the heavy capacitive loading on word line WB which is shared by many ECL cells 1.

Figure 2:
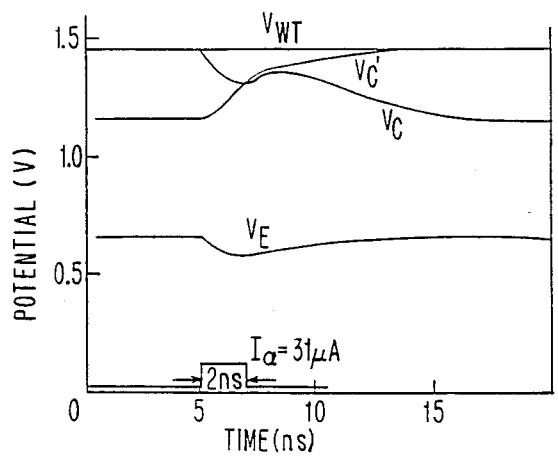
FIG. 2 is a plot of Potential (V) vs Time (ns) showing the change in storage node potential and the common-emitter node potential when a current transient is induced in the circuit of FIG. 1 by an α-particle.

The above described actions are plotted in FIG. 2 which on a Potential (V) vs Time (ns) plot shows the changes in storage node potentials and the common-emitter node potential when a current transient is induced in the circuit of FIG. 1. In FIG. 2, the standby potential on word line 2 is shown as $V_{WT}$; the potentials at the collector nodes C,C' as $V_C$, $V_{C'}$, respectively, and the potential at the common-emitter node as $V_E$. Also, shown is a 2 ns transient current which is representative of an α-particle strike. Using the amount of charge in the 2 ns current pulse flowing from the collector of the OFF transistor that flips the ON transistor to OFF, a factor known as $Q_{CRIT}$ can be determined. Whether or not the current transient causes a temporary disturbance or causes the cell to change its state (soft-error) depends on whether or not the amount of charge in the current transient is less or greater than the $Q_{CRIT}$ of the memory cell. In the instance of FIG. 2, the amount of charge in the 2 ns current pulse is greater than the $Q_{CRIT}$ of the memory cell because it causes ON transistor 5 in FIG. 1 to flip from the ON state to the OFF state. Note in FIG. 2 that the potential $V_C$ on collector node C continues to fall after the current pulse transient. This, in turn, reduces the potential on the base of transistor 5 while the potential on emitter 12 represented by $V_E$ in FIG. 2 changes only slightly. As a result, the base-emitter potential, $V_{BE}$ of transistor drops to a point where transistor 5 turns OFF and transistor 6 turns ON reversing the state of ECL cell 1 from its original state.

At this point, it was appreciated that the $Q_{CRIT}$ of ECL cell 1 of FIG. 1 could be increased by controlling the sudden fall in the $V_{BE}$ of the 0N transistor of ECL cell 1. This control is achieved by allowing common-emitter node E to follow the dip in voltage at the OFF device collector node. In this way, the base-emitter potential, $V_{BE}$, of the ON transistor remains substantially the same during the course of the transient and the ON transistor of ECL cell 1 remains ON. One way to permit $V_{BE}$ to remain at a level sufficient to hold the conducting transistor in the ON state is shown in FIG. 3.

Figure 3:
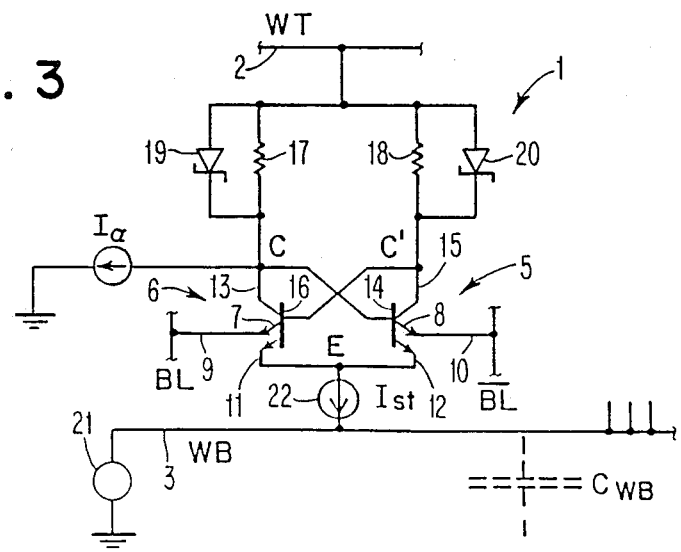
FIG. 3 is a schematic drawing of an Emitter Coupled Logic (ECL) cell in accordance with the teaching of the present invention wherein the common-emitter node is connected to a lower word line by means of a constant current source.
Figure 4:
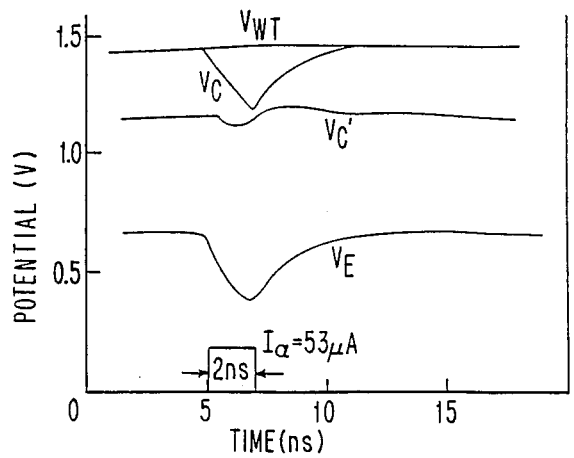
FIG. 4 is a plot of Potential (V) vs Time (ns) showing the change in storage node potentials and the common-emitter node potential when a current transient is induced in the circuit of FIG. 3 by an α-particle. In this instance, the changes in collector potential ($V_C$) is tracked by the changes in emitter node potential and the base-emitter voltage ($V_{BE}$) of the ON transistor remains at essentially the same value it had prior to the α-particle strike.

FIG. 3 is a schematic drawing of an Emitter Coupled Logic (ECL) cell in accordance with the teaching of the present invention wherein the common-emitter node is connected to a lower word line by means of a constant current source. The elements in FIG. 3 which are the same as elements in FIG. 1 have been given the same reference characters. Thus, FIG. 1 and FIG. 2 are identical except that resistor $R_E$ of FIG. 1 has been replaced in FIG. 3 by a constant current source 22 which permits common-emitter node E to follow the change in potential at collector node C, for example, when the collector of OFF transistor 6 experiences an α-particle strike. By introducing constant current source 22, the capacitance encountered at common-emitter node is reduced to a very small value relative to the very high capacitance encountered when node E is connected directly to word line WB or connected to WB via resistor $R_E$. The resulting reduction in capacitance permits node E to swing freely. As a further result, the common-emitter potential, $V_E$, falls at the same time as the collector potential of the OFF transistor on node C falls. Thus, $V_{BE}$ remains substantially the same during and after an α-particle strike providing sufficient voltage to maintain the ON transistor in that state. FIG. 4 shows a plot of what has just been described.

FIG. 4 is a plot of potential vs time showing the change in storage node potentials and the common-emitter node potential when a current transient is induced in the circuit of FIG. 3 by an α-particle. In the plot, the changes in collector potential, $V_C$, are tracked by the changes in the potential at emitter node E causing the base-emitter voltage, $V_{BE}$, of the ON transistor of ECL cell 1 to remain at essentially the same value it had prior to an α-particle strike. The 2 ns pulse shown at the bottom of the plot of FIG. 4 when compared with the 2 ns pulse shown at the bottom of the plot of FIG. 2 clearly shows that the pulse of FIG. 4 provides a greater amount of charge than that of FIG. 2 and, thus, it can be said that the $Q_{CRIT}$ of the circuit of FIG. 3 is greater than that of the circuit of FIG. 1. Using a 2ns wide pulse as a basis for determining $Q_{CRIT}$ as discussed in an article entitled, "Soft error rates in static bipolar RAMs", by G. Sai-Halasz and D. Tang, IEEE Digest of IEDM 1983, pp. 344–347, one can determine at what current, $I_\alpha$, the state of an ECL cell flips under α-particle strike conditions. Consideration of FIG. 2 shows that ECL cell 1 has changed state when an $I_\alpha$ of 31 μA is drawn from collector node C of FIG. 1. Computer simulation results have shown that a current pulse having the same 2 ns pulse width with a current of slightly less than 30 μA keeps ECL cell 1 from changing its state. This provides:

$$Q_{CRIT} = \text{Pulse width} \times \text{current}$$
$$= 2\text{ns} \times <30 \text{ μA}$$
$$Q_{CRIT} = 59 \text{ femto coulombs (fc)}$$

A similar consideration of FIG. 4 shows that ECL cell 1 has not changed state when an $I_\alpha$ of 53 μA is drawn from collector node C of FIG. 3. Computer simulation results have shown that a current pulse having the same 2 ns width with a current slightly less than 57 μA keeps ECL cell 1 of FIG. 3 from changing its state. This provides:

$$Q_{CRIT} = \text{Pulse width} \times \text{current}$$
$$= 2\text{ns} \times 56 \text{ μA}$$
$$Q_{CRIT} = 112 \text{ femto coulombs (fc)}$$

From the above, it should be clear that the substitution of constant current source 22 for resistor $R_E$ which permits node E to float, results in a $Q_{CRIT}$ twice as great as an ECL cell which incorporates only a resistor. Based on calculations for cells of similar layout and dimensions, the improvement in $Q_{CRIT}$ should result in more than 8–10 times improvement in the error rate which has been experimentally verified.

In embodying the circuit of FIG. 3, constant current source 22 may be any d.c. current source having an output current equal to the standby current of ECL cell 1. A preferred embodiment using a current mirror concept is shown in FIG. 5.

Figure 5:
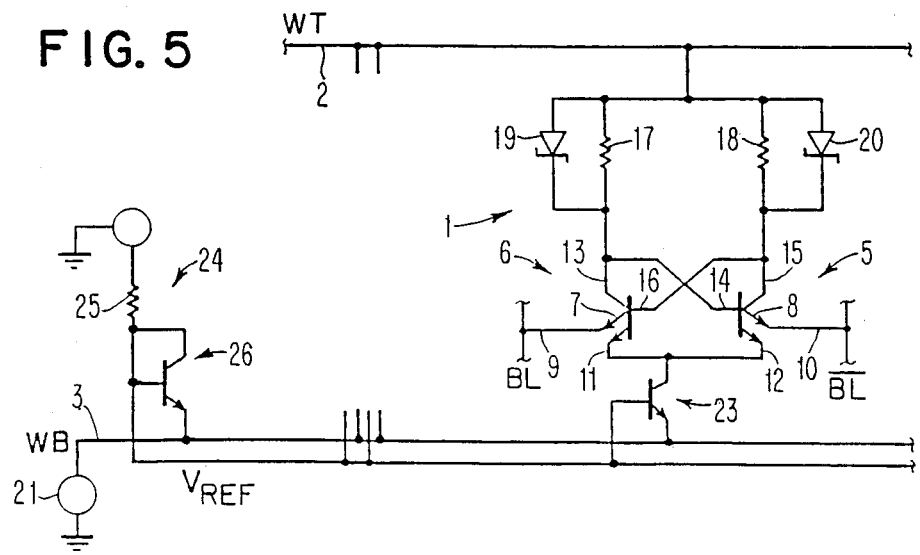
FIG. 5 is a schematic drawing of an ECL cell in accordance with the teaching of the present invention wherein the constant current source connected between the common-emitter node and the lower word line is implemented by a current mirror circuit and a current mirror transistor connected to each ECL cell.

FIG. 5 is a schematic drawing of an ECL cell in accordance with the teaching of the present application wherein the constant current source connected between the common-emitter node and the lower word line of an ECL cell is implemented by a current mirror circuit and a current mirror transistor connected to each ECL memory cell. Elements of FIG. 5 which are the same as elements shown in FIGS. 1,3 have been given the same reference characters. The differences are that constant current source 22 is substituted for by a current mirror transistor 23 and a current mirror circuit 24. The current mirror arrangement shown in FIG. 5 operates in a known manner. Thus, when one of the transistors 5 or 6 of ECL cell 1 is in the ON or conducting state, the amount of current flowing in it is controlled by the amount of current flowing in a resistor 25 which is connected to the collector and base of a transistor 26. The emitter of transistor 26 is connected to lower word line WB while the base thereof is connected to a reference potential $V_{REF}$. Similarly, the emitter of current mirror transistor 23 is connected to lower word line WB and the base thereof is connected to $V_{REF}$. The collector of transistor 23 is connected to common-emitter node E of ECL cell 1. The capacitance at node E of ECL cell 1 is, therefore, the collector-base capacitance and the collector-isolation capacitance of the current mirror transistor 23, typically in the order of 40–50 fF rather than the capacitance of the relatively long lower word line WB. The capacitance of the latter is in the order of pF. To the extent that transistor 23 acts as a constant current source, similar results to those obtained with the circuit of FIG. 3 are achieved with the circuit arrangement of FIG. 5. Thus, when an α-particle strikes the collector node C, for example, of OFF transistor 6, a plot substantially similar to that shown in FIG. 4 will be obtained and common-emitter node E will change with or track the collector voltage, $V_C$.

Since the method of fabrication of the circuits described above forms no part of the present invention, little reference has been made to how the circuits are made. Suffice it to say that well-known integrated circuit techniques and methods may be invoked which are well within the abilities of one skilled in the semiconductor fabrication and manufacturing arts. Thus, any semiconductor such as silicon may be used and the various elements involved may be formed using well-known photolithographic and etching techniques, diffusion or ion implantation techniques and interconnection and oxidation techniques. Finally, while npn transistors have been indicated in connection with the above described circuits, it should be appreciated that pnp transistors may be utilized without departing from the spirit of the present invention.

Having thus described our invention, what we claim as new, and desire to secure by Letters Patent is:

1. A semiconductor memory comprising:
   a plurality of emitter coupled logic memory cells arranged in rows and columns each of said cells including a pair of multi-emitter transistors,
   each of said pair of multi-emitter transistors having at least two emitters, a collector and a base,
   the base and collector of one of said pair of multi-emitter transistors being cross-coupled to those of the other,
   the collectors of said pair of multi-emitter transistors being connected via load means to a first word line,
   one emitter of each of said pair of multi-emitter transistors being connected to an associated bit line,
   the other emitter of each of said pair of multi-emitter transistors being commonly connected together, and
   a current source connected to a second word line characterized by
   means connected between said commonly connected other emitters and said second word line for reducing spurious switching in each of said memory cells due to α-particle radiation.

2. A semiconductor memory according to claim 1 wherein said means for reducing spurious switching is a constant current source.

3. A semiconductor memory according to claim 1 wherein said means for reducing spurious switching is a current mirror circuit which includes a transistor the collector and base of which is connected via a load resistor to a source of voltage and the emitter of which is connected to said second word line and a current mirror transistor connected to each of said cells the collector of each said current mirror transistor being connected to said commonly connected other emitter of an associated memory cell, the emitter of each said current mirror transistor being connected to said second word line and the bases of said current mirror transistor and each said a transistor being connected together.

4. A semiconductor memory comprising:
   a plurality of emitter coupled logic memory cells each of said cells having a pair of emitters commonly connected at a node,
   each of said cells being connected to an upper word line and a lower word line and a shared constant current source connected to said lower word line characterized by
   means connected between said lower word line and each of said nodes for permitting the potential at each of said nodes to float when said cell experiences an α-particle strike.

5. A semiconductor memory according to claim 4 wherein said means for permitting said nodes to float is a constant current source.

6. A semiconductor memory according to claim 4 wherein said means for permitting said nodes to float is a current mirror circuit which includes a transistor the collector and base of which is connected via a load resistor to a source of voltage and the emitter of which is connected to said lower word line and a current mirror transistor connected to each of said cells the collector of each said current mirror transistor being connected to said commonly connected other emitter of an associated memory cell, the emitter of each said current mirror transistor being connected to said lower word line and the bases of said current mirror transistor and each said a transistor being connected together.

* * * * *